US006236216B1

(12) United States Patent
Shimoyama et al.

(10) Patent No.: US 6,236,216 B1
(45) Date of Patent: May 22, 2001

(54) TEMPERATURE/VOLTAGE DETECTING UNIT AND BATTERY ELEMENT UNIT

(75) Inventors: Kenichi Shimoyama; Yoichi Arai, both of Shizuoka-ken; Toshifumi Maemoto, Hiroshima-ken, all of (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/231,964

(22) Filed: Jan. 15, 1999

(30) Foreign Application Priority Data

Jan. 19, 1998 (JP) .................................................. 10-007856

(51) Int. Cl.[7] .............................. G01N 27/416; H02J 7/04
(52) U.S. Cl. ............................................. 324/434; 320/144
(58) Field of Search ...................................... 324/434, 431, 324/432, 433; 320/144, 153, 138

(56) References Cited

U.S. PATENT DOCUMENTS

| 4,820,966 | * | 4/1989 | Fridman ................................ | 324/434 |
| 5,710,503 | * | 1/1998 | Sideris et al. ........................ | 324/431 |
| 5,808,469 | * | 9/1998 | Kopera ................................. | 324/431 |

FOREIGN PATENT DOCUMENTS

| 7-307170 | 11/1995 | (JP) . |
| 9-139237 | 5/1997 | (JP) . |

* cited by examiner

*Primary Examiner*—Safet Metjahic
*Assistant Examiner*—J. Kerveros
(74) *Attorney, Agent, or Firm*—Finnegan, Henderson, Farabow, Garrett & Dunner, L.L.P.

(57) ABSTRACT

A temperature/voltage detecting unit has a temperature detector and a voltage detector. The temperature detector has a light electric system stabilized power supply for stabilizing a light electric system power supply voltage, a temperature resistance element provided close to a corresponding battery element, for changing its resistance value based on a change in temperature, and a voltage-to-frequency converter operating based on a voltage from the light electric system stabilized power supply, for detecting a terminal voltage of the temperature resistance element to which a constant current flows from the light electric system stabilized power supply, converting this value into frequency information and outputting the frequency information. The voltage detector has a heavy electric system stabilized power supply for stabilizing a voltage supplied from the corresponding battery element, a voltage supply control section for inputting a signal to show whether or not the light electric system power supply voltage is being applied to the temperature detector, and, when this voltage is being supplied, for applying a voltage from the corresponding battery element to the heavy electric system stabilized power supply, and a voltage-to-frequency converter operating based on a voltage from the light electric system stabilized power supply, for detecting a terminal voltage of the corresponding battery element, converting this value into frequency information and outputting the frequency information.

9 Claims, 4 Drawing Sheets

TEMPERATURE/VOLTAGE DETECTING UNIT AND BATTERY ELEMENT UNIT

BACKGROUND OF THE INVENTION

1. Technical Field of the Invention

The present invention relates to a temperature/voltage detecting unit for detecting a temperature and a terminal voltage of each of batteries of a heavy electric system for supplying a voltage to a motor for operating an electric car.

Further, the present invention relates to a battery element unit having a battery element and a temperature/voltage detecting unit corresponding to this battery element.

2. Description of Prior Art

Conventionally, electric cars are run by rotationally driving a motor which is supplied with a voltage from a battery of a heavy electric system. Recently, along with the progress of development of batteries with high performance of charge and discharge functions, there has been an increasingly strong demand for voltage management and temperature management of these batteries. For example, a heavy electric system battery for a driving system is structured by about twenty to thirty battery elements connected in series, and it has become necessary to manage both voltage and temperature of each of these battery elements. Therefore, a voltage detector and a temperature detector are necessary by the number of these battery elements.

As a conventional voltage detector, there has been used a voltage detector to which a zero magnetic flux method is applied as shown in FIG. 1. A voltage detector 101 shown in FIG. 1 has a magnetic core 103 which is wound up with a primary winding 105 and a secondary winding 107. The primary winding 105 is connected with a heavy electric system battery 111 structured by a plurality of power supplies 111$a$, 111$b$, . . . , and 111$n$ connected in series, through a resistor 109. A Hall element 115 is provided in a gap 113 formed on a magnetic core 103.

In this case, a magnetic flux$\Phi_1$ is generated within the magnetic core 103 by the primary current $I_1$ flowing through the primary winding 105, and the Hall element 115 for detecting this magnetic field generates a voltage corresponding to a direction of the magnetic field and a size of the magnetic field, and outputs this voltage to a current amplifier 117. The current amplifier 117 amplifies a current based on the voltage from the Hall element 115 and flows an output current $I_2$ to the secondary winding 107. When the output current $I_2$ flows to the secondary winding 107, a magnetic flux$\Phi_2$ is generated. In this case, the magnetic flux$\Phi_2$ works to cancel the magnetic flux$\Phi_1$.

When the magnetic flux$\Phi_2$ becomes equal to the magnetic flux$\Phi_1$, the magnetic flux$\Phi_1$ within the magnetic core 103 becomes zero. Accordingly, the Hall element 115 makes the output zero, and the magnetic flux$\Phi_2$ also becomes zero. In this state, the magnetic flux$\Phi_1$ is generated again within the magnetic core 103 and an output is generated in the Hall element 115 as well, so that the magnetic flux$\Phi_2$ becomes larger than the magnetic flux$\Phi_1$ within the magnetic core 103. This operation is repeated in high frequency, and the output current $I_2$ is made as an effective value. At this time, the following law of equal ampere-turns is established.

$$N_1 \cdot I_1 = N_2 \cdot I_2.$$

When the output current $I_2$ from the current amplifier 117 is measured by using this expression, the primary current $I_1$ can be obtained. A detection voltage across both ends of the resistor 119 becomes a voltage proportional to the output current $I_2$.

However, according to the prior-art technique, a unit having a voltage detector and a unit having a temperature detector are provided separately for each battery element, and therefore, a battery unit as a whole has a large size for these detectors and a considerably large space has been necessary for these detectors.

Further, although the prior-art voltage detector has high precision, this has required a large size for the. magnetic core 103, the primary winding 105 and the secondary winding 107, resulting in a high cost as well.

SUMMARY OF THE INVENTION

It is an object of the present invention to provide a compact and low-cost temperature/voltage detecting unit having a temperature detector and a voltage detector accommodated together therein, with insulation property.

Further, it is another object of the present invention to provide a battery element unit for accommodating the above temperature/voltage detecting unit in a groove portion on an external wall of the battery element unit.

In order to achieve the above objects, there is provided a temperature/voltage detecting unit corresponding to each of a plurality of battery elements connected in series that constitute a heavy electric system power supply for an electric car, the temperature/voltage detecting unit comprising: a temperature detector for detecting a temperature of a corresponding battery element when a light electric system power supply voltage is being applied; and a voltage detector for inputting a signal to show whether or not the light electric system power supply voltage is being applied to the temperature detector, and, when this voltage is being supplied, for detecting a terminal voltage of the corresponding battery element in a state electrically insulated from the signal.

In a preferred embodiment of the present invention, the temperature detector comprises: a light electric system stabilized power supply for stabilizing the light electric system power supply voltage: a temperature resistance element provided close to a corresponding battery element, for changing a resistance value thereof based on a change in the temperature of the battery element; and a resistance terminal voltage detector operating based on a voltage from the light electric system stabilized power supply, for detecting a terminal voltage of the temperature resistance element to which a constant current flows from the light electric system stabilized power supply.

In another preferred embodiment of the present invention, the temperature detector further comprises a voltage-to-frequency converter for converting a value of the terminal voltage detected by the resistance terminal voltage detector into frequency information and outputting the frequency information.

In still another preferred embodiment of the present invention, the voltage detector comprises: a heavy electric system stabilized power supply for stabilizing a voltage supplied from a corresponding battery element; a voltage supply control section for inputting a signal to show whether or not the light electric system power supply voltage is being applied to the temperature detector, and, when the light electric system power supply voltage is being supplied, for applying the voltage from the corresponding battery element to the heavy electric system stabilized power supply; and a battery element terminal voltage detector operating based on a voltage from the light electric system stabilized power supply, for detecting the terminal voltage of the corresponding battery element.

In yet still another preferred embodiment of the present invention, the voltage detector further comprises a voltage-to-frequency converter for converting a value of the terminal voltage detected by the battery element terminal voltage detector into frequency information and outputting the frequency information.

In a further preferred embodiment of the present invention, the voltage supply control section comprises: a light-emitting diode for inputting a signal to show whether or not the light electric system power supply voltage is being applied to the temperature detector, and for emitting light or non-emitting light depending on whether or not the light electric system power supply voltage is being applied; a photo-transistor for being turned on/off according to light emission/non-light emission of the light-emitting diode; and a transistor for applying the voltage from the corresponding battery element to the heavy electric system stabilized power supply according to on/off of the photo-transistor.

Further, in order to achieve the above objects, there is provided a battery element unit, comprising: the above temperature/voltage detecting unit; and a battery element body having a groove for accommodating the temperature/voltage detecting unit on an external wall thereof.

The nature, principle and utility of the invention will become more apparent from the following detailed description when read in conjunction with the accompanying drawings.

DESCRIPTION OF THE PREFERRED EMBODIMENTS

There will be described in detail below embodiments of a temperature/voltage detecting unit according to the present invention with reference to the accompanying drawings.

Figure 1:
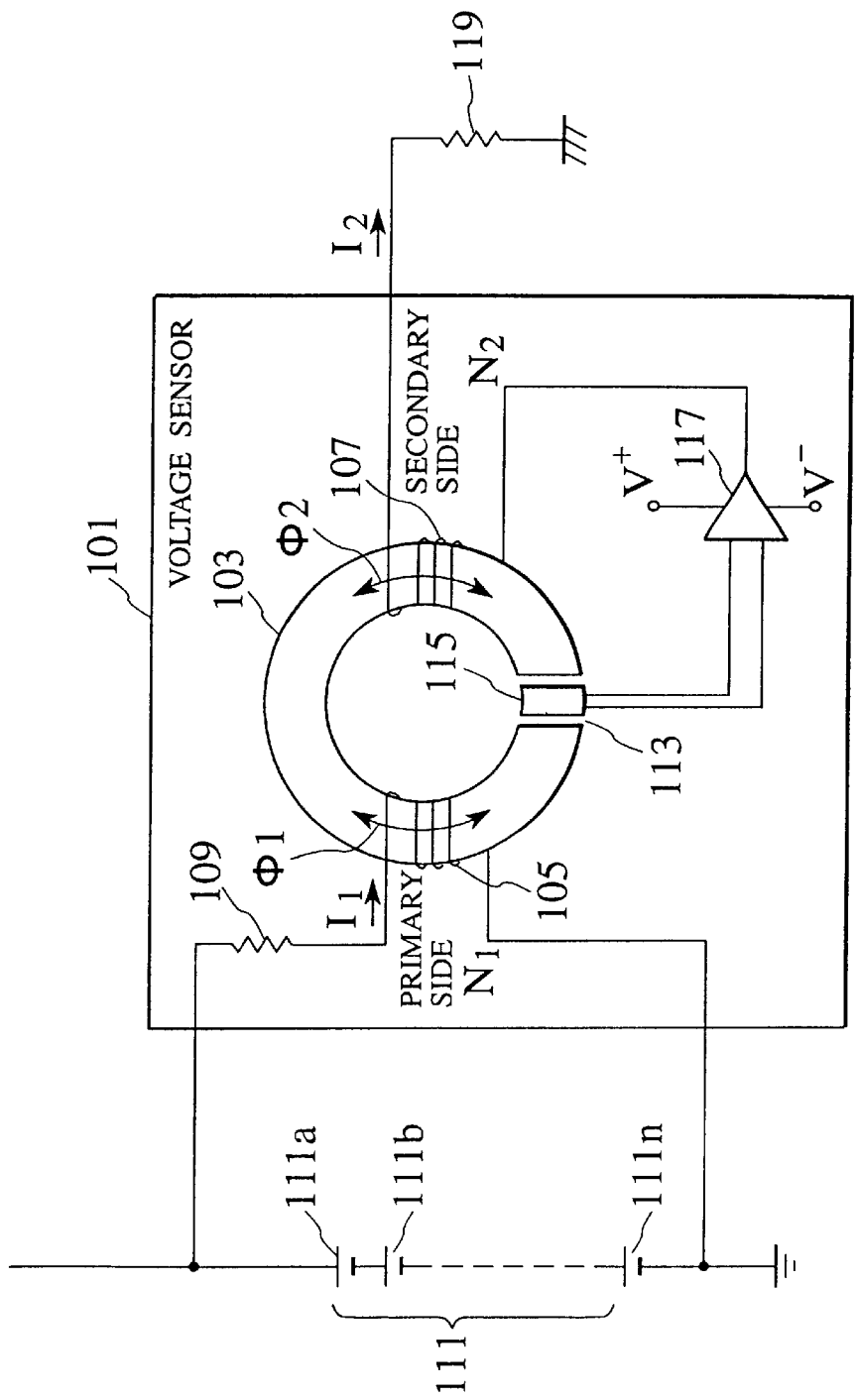
FIG.1 is view for showing a structure of a prior-art voltage detector.
Figure 2:
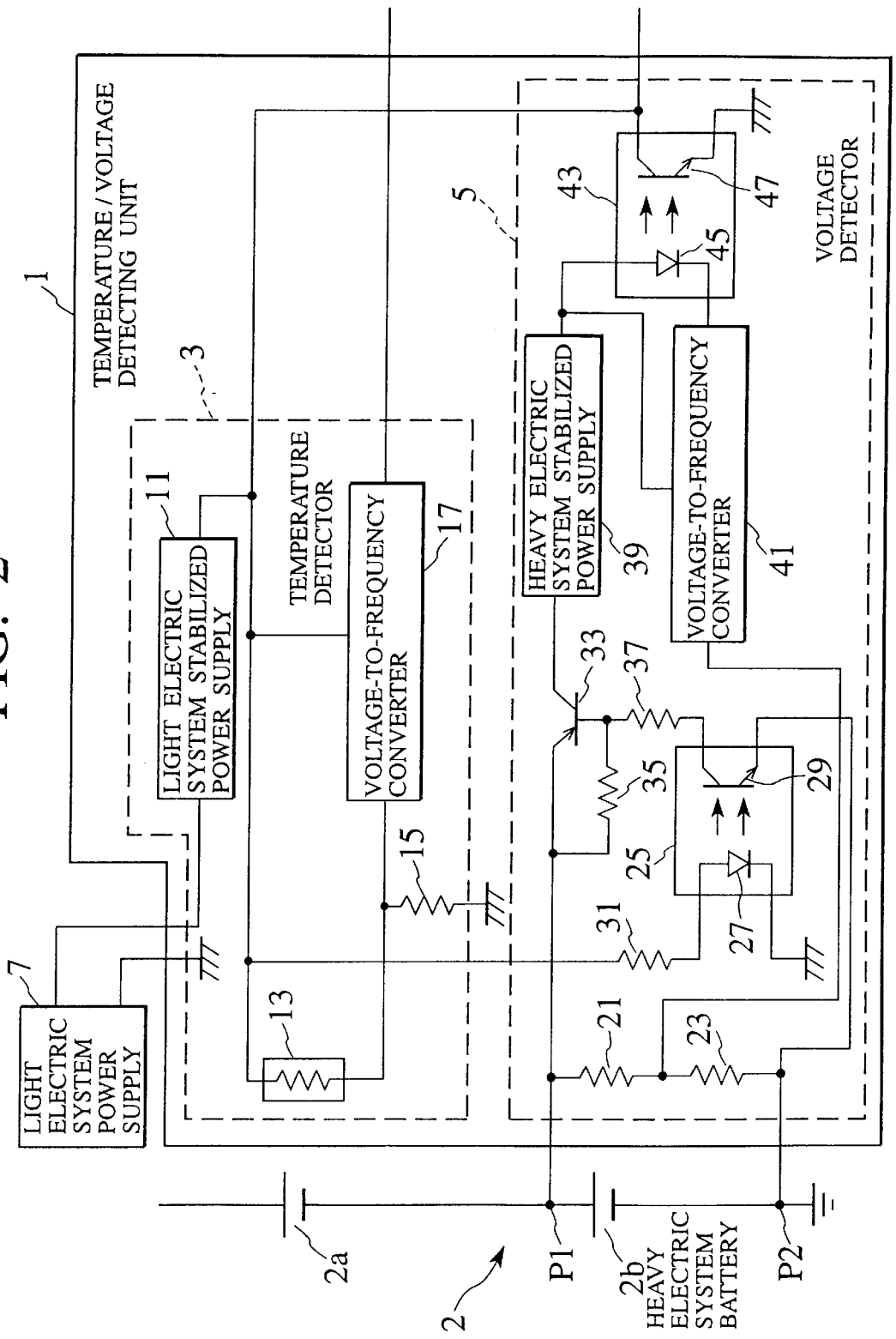
Fig. 2 is a circuit configuration diagram showing an embodiment of a temperature/voltage detecting unit according to the present invention.

FIG.2 shows a circuit configuration diagram showing a temperature/voltage detecting unit in one embodiment of the present invention. A temperature/voltage detecting unit 1 shown in FIG. 2 is for detecting a temperature and a terminal voltage of each battery element of a heavy electric system battery 2 structured by a series connection of a plurality of battery elements 2a, 2b, . . . The heavy electric system battery 2 has a circuit power supply structured at a primary side to supply a high voltage to a motor for rotationally driving the motor to thereby run an electric car.

The temperature/voltage detecting unit 1 has a temperature detector 3 for detecting a temperature of a battery element (for example, a battery 2b) of a heavy electric system, and a voltage detector 5 for detecting a terminal voltage of the battery element of the heavy electric system.

A light electric system power supply 7 is a +12 V power supply, for example, and supplies a voltage to the temperature detector 3 and the voltage detector 5 when the temperature detector 3 detects a temperature of the battery 2b and the voltage detector 5 detects a terminal voltage of this battery, more specifically, when an ignition is ON or during a charging of the battery, for example. For this purpose, the light electric system power supply 7 has switching elements such as a switching transistor and a relay not shown, for example.

The temperature detector 3 has a light electric system stabilized power supply 11, a thermistor resistor 13, a detection resistor 15 and a voltage-to-frequency converter (V/F) 17. The light electric system stabilized power supply 11 stabilizes a voltage from the light electric system power supply 7 and supplies the voltage of the light electric system to the thermistor resistor 13, the voltage-to-frequency converter 17, a resistor 31 within the voltage detector 5 and a second photo-transistor 47 within the voltage detector 5. The light electric system stabilized power supply 11 is a +5 V power supply, for example.

A resistance value of the thermistor resistor 13 changes according to a change in the temperature of the battery 2b, and the detection resistor 15 is connected in series to this thermistor 13. The voltage-to-frequency converter 17 Inputs a voltage value generated by a division of a voltage according to respective resistance values of the thermistor resistor 13 and the detection resistor 15, then converts the input voltage value into a frequency corresponding to this value and outputs this frequency information.

The frequency information from the voltage-to-frequency converter 17 Is sent to a battery controller not shown and is then processed by this battery controller, so that a temperature of the battery element is measured.

In the voltage detector 5, a resistor 21 and a resistor 23 are connected in series on both ends of the battery 2b. The voltage detector 5 is provided with a first photo-coupler 25 which is structured by a first light-emitting diode 27 as a light-emitting element and a first photo-transistor 29 as a light-receiving element.

The first light-emitting diode 27 structures an input side, i.e. primary side, and the first photo-transistor 29 structures an output side, i.e. secondary side. The primary side and the secondary side are isolated from each other. A cathode of the first light-emitting diode 27 is grounded, and an anode of the first light-emitting diode 27 is connected to the light electric system stabilized power supply 11 through the resistor 31.

The first light-emitting diode 27 emits light when a voltage of the light electric system stabilized power supply 11 is supplied through the resistor 31, that is, when a temperature and a voltage of the battery 2b are detected. The first photo-transistor 29 receives the light of the first light-emitting diode 45 and operates a transistor 33.

An emitter of the transistor 33 is connected to a positive electrode side (a heavy electric system battery terminal P1) of the battery 2b, and a resistor 35 is connected between the emitter and a base of the transistor 33. The base of the transistor 33 is connected to a collector of the first photo-transistor 29 through a resistor 37, and an emitter of the first photo-transistor 29 is connected to a negative electrode side (a heavy electric system battery terminal P2) of the battery 2b.

To a collector of the transistor 33, there is connected a heavy electric system stabilized power supply 39 for stabilizing a voltage from the battery 2b through the transistor 33. This heavy electric system stabilized power supply 39 supplies a stabilized voltage to a voltage-to-frequency converter 41 and an anode of a second light-emitting diode 45 within a second photo-coupler 43.

The second photo-coupler 43 is structured by the second light-emitting diode 45 as a light-emitting element and the second photo-transistor 47 as a light-receiving element. The second light-emitting diode 45 structures an input side, i.e. primary side, and the second photo-transistor 47 structures an output side, i.e. secondary side. The primary side is a heavy electric system and the secondary side is a light electric system, and the heavy electric system and the light electric system are isolated from each other. To a collector of the second photo-transistor 47, there is applied a voltage of the light electric system stabilized power supply 11 for operating the second photo-transistor 47.

The voltage-to-frequency converter 41 inputs a voltage value generated by a division of a voltage according to respective resistance values of the resistor 21 and the resistor 23, then converts the input voltage value into a frequency corresponding to this value and outputs this frequency information to a cathode of the second light-emitting diode 45.

The second light-emitting diode 45 emits/non-emits light in a light emission frequency according to the frequency of the frequency information from the voltage-to-frequency converter 41. The second photo-transistor 47 receives the light of the second light-emitting diode 45 and switches the light into frequency information in a frequency corresponding to a terminal voltage of the battery element 2b.

The frequency information from the second photo-transistor 47 is sent to a battery controller not shown, and is processed by the battery controller to measure the terminal voltage of the battery element. An emitter of the second photo-transistor 47 is grounded.

Figure 3:
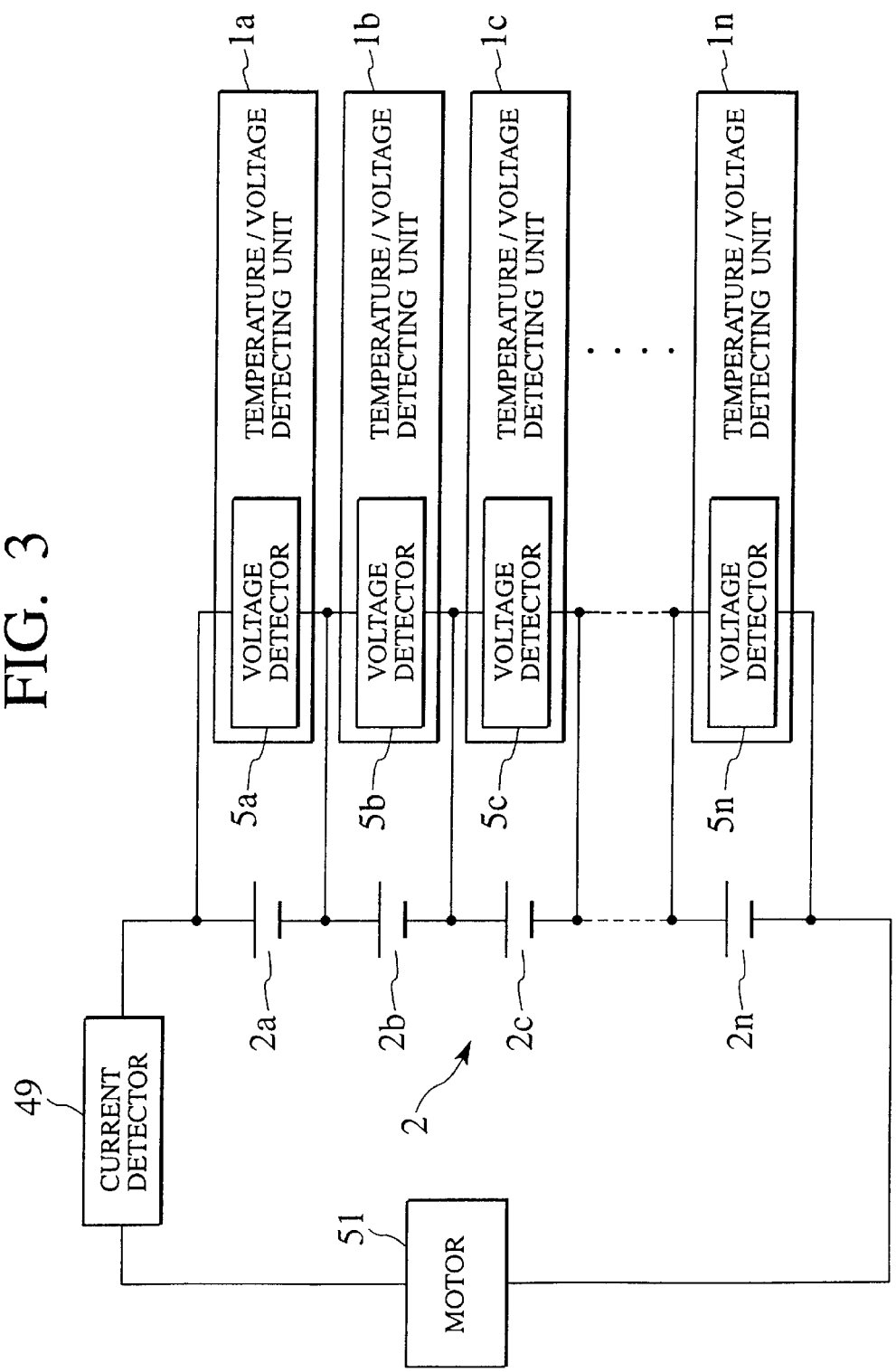
FIG. 3 is a configuration diagram of each temperature/voltage detecting unit for detecting a temperature and a voltage of each of a plurality of batteries connected in series.

FIG. 3 shows a configuration diagram of each temperature/voltage detecting unit for detecting a temperature and a voltage of each of a plurality of battery elements connected in series. As shown in FIG. 3, temperature/voltage detecting units 1a, 1b, 1c, . . . , and 1n are provided corresponding to battery elements 2a, 2b, 2c, . . . , and 2n. Voltage detectors 5a, 5b. 5c, . . . , and 5n are connected to both ends of the corresponding battery elements 2a, 2b, 2c . . . , and 2n. Each of the temperature/voltage detecting units 1a, 1b, 1c, . . . , and 1n has the same structure as that of the temperature/voltage detecting unit 1 shown in FIG. 2.

Each battery element is 12 V and a total voltage of the batteries is 28 V, for example. A motor 51 is connected as a load of an electric car to both ends of the total batteries through a current detector 49. The current detector 49 detects a current flowing through the motor 51.

Figure 4:
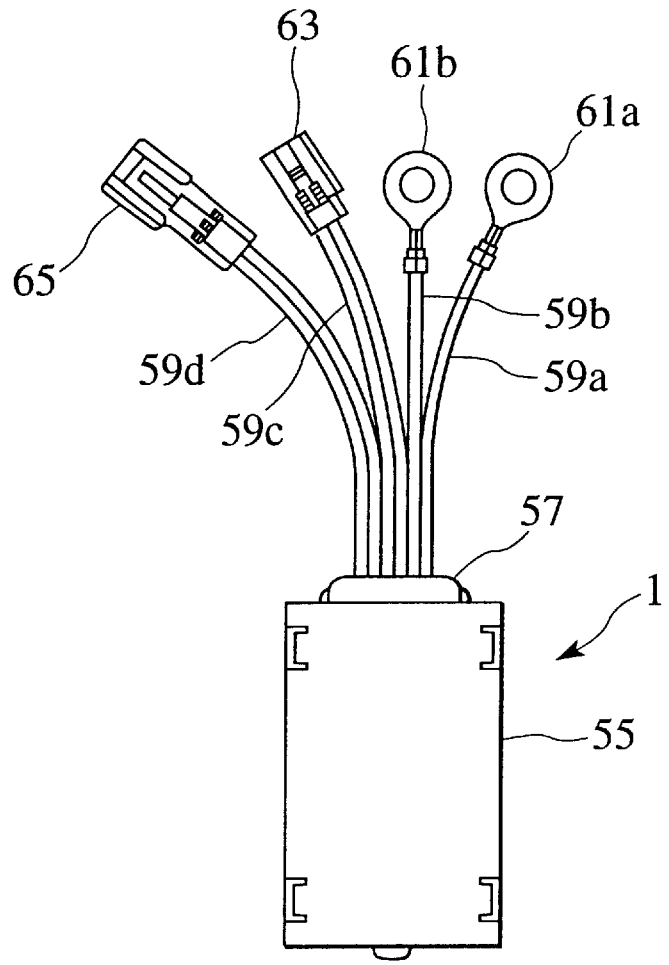
FIG. 4 Is an external view for showing a configuration of each temperature/voltage detecting unit.

FIG. 4 shows an external view of a configuration of each temperature/voltage detecting unit. In the temperature/voltage detecting unit 1 shown in FIG. 4, there is provided a box-shaped accommodation case 55 for accommodating the above-descrlbed temperature detector 3 and the voltage detector 5. Wires 59a, 59b, 59c and 59d are connected to this accommodation case 55 through a connector 57.

A ring terminal 61a is fitted to a front end of the wire 59a, and this ring terminal 61a is connected to the heavy electric system battery terminal P2 (the load side) shown in FIG. 2. A ring terminal 61b is fitted to a front end of the wire 59b. and this ring terminal 61b is connected to the heavy electric system battery terminal P1 (the positive electrode side) shown in FIG. 2. There is input a terminal voltage of the heavy electric system battery element to the voltage detector 5 within the accommodation case 55 through the ring terminals 61a and 61b.

A connector 63 is fitted to a front end of the wire 59c, and this connector 63 Is connected to the light electric system power supply 7 shown in FIG. 2. A voltage of the light electric system is applied to each of the temperature detector 3 and the voltage detector 5 within the accommodation case 55 through this connector 63.

A connector 65 is fitted to a front end of the wire 59d, and this connector 65 outputs frequency information from the voltage-to-frequency converter 17 within the temperature detector 3 within the accommodation case 55 and from the voltage-to-frequency converter 41 within the voltage detector 5.

According to this temperature/voltage detecting unit 1, as the temperature detector 3 and the voltage detector 5 are accommodated in the accommodation case 55 within the same unit, this has an effect that the unit can be provided in compact at low cost, as compared with the case where the temperature detector 3 and the voltage detector 5 are accommodated in separate units. Further, as the temperature/voltage detecting unit 1 is provided for each battery, this has a large effect.

Figure 5:
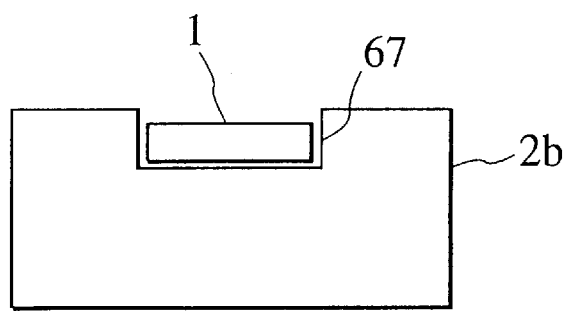
FIG. 5 is a view for showing a temperature/voltage detecting unit accommodated in a groove of a battery element unit.

Further, as shown in FIG. 5, there may be provided a temperature/voltage detecting unit 1 for each battery element, such as for, example, in a groove portion 67 of the battery element 2b. With this arrangement, a space occupied by the temperature detector 3 and the voltage detector 5 is not necessary and the peripheral structure of the batteries can be simplified.

Furthermore, by accommodating the temperature detector 3 and the voltage detector 5 in the same unit, electric wires for the heavy electric system becomes unnecessary. These detectors are optimum as a temperature detector and a voltage detector for an electric car for managing the temperature and voltage of each battery element.

Next, the operation of the temperature/voltage detecting unit of the present embodiment having the above-described structure will be explained with reference to FIG. 2. At first, the light electric system power supply 7 applies a voltage to the light electric system stabilized power supply 11 at the time of detecting a temperature and a terminal voltage of the battery element 2b. Then, at the detection time, the light electric system stabilized power supply 11 applies a stabilized voltage to the thermistor resistor 13, the voltage-to-frequency converter 17, the resistor 31 and the second photo-transistor 47.

Then, a current flows from the light electric system stabilized power supply 11 to the thermistor resistor 13 and the detection resistor 15. The resistance value of the thermistor resistor 13 changes according to a change in the temperature of the battery 2b. A voltage value generated by a division of a voltage according to respective voltage values of the thermistor resistor 13 and the detection resistor 15 is input to the voltage-to-frequency converter 17. The voltage-to-frequency converter 17 converts the input voltage value into a frequency information according to this value, and outputs this frequency information to a battery controller not shown.

On the other hand, in the voltage detector 5, when a temperature and a voltage of the battery element 2b are detected, a voltage from the light electric system stabilized power supply 11 is applied to the first light-emitting diode 27 through the resistor 31, so that the first light-emitting diode 27 emits light.

Then, the first photo-transistor 29 operates upon receiving the light of the first light-emitting diode 27, and a current flows from the positive electrode side of the battery element 2b to the negative electrode side of the battery element 2b through the resistor 35, the resistor 37 and the first photo-transistor 29.

Thus, the transistor 33 operates, and a voltage of the heavy electric system of the battery element 2b is applied to the heavy electric system stabilized power supply 39. Then, the heavy electric system stabilized power supply 39 applies a stabilized voltage to the voltage-to-frequency converter 41 and the second light-emitting diode 45 only at the time of detecting a temperature and a voltage of the battery element 2b.

Further, when a voltage value generated by a division of a voltage according to the respective resistance values of the resistor 21 and the resistor 23 is input to the voltage-to-frequency converter 41, the voltage-to-frequency converter 41 converts the input voltage value into a frequency information according to this value and outputs this frequency to the cathode of the second light-emitting diode 45. Then, the second light-emitting diode 45 emit/non-emits light in a light emission frequency according to the frequency of the frequency information from the voltage-to-frequency converter 41. The second photo-transistor 47 receives the light of the second light-emitting diode 45 and switches the light into frequency information in a frequency corresponding to a terminal voltage of the battery element 2b.

Then, a battery controller not shown processes the frequency information from the temperature detector 3 and the frequency information from the voltage detector 5, and measures the temperature and the terminal voltage of the battery element 2b.

As explained above, according to the temperature/voltage detecting unit of the present embodiment, since the voltage detector 5 is structured by using the first photo-coupler 25 and the second photo-coupler 43 having insulation, it is possible to provide a compact and low-cost temperature/voltage detecting unit having insulation, as compared with a voltage detector using the zero magnetic flux method.

Further, as the light electric system power supply 7 drives the heavy electric system stabilized power supply 39 to operate the voltage-to-frequency converter 41 and the second light-emitting diode 45 only at the time of detecting a temperature and a voltage of the battery element 2b, it becomes possible to avoid a dark current flowing from the heavy electric system stabilized power supply 39, that has received a voltage supply from the battery 2b of the heavy electric system, to the voltage-to-frequency converter 41 and the second photo-diode 45 within the second photo-coupler 43, at the time of other than the detection of the temperature and the voltage of the battery element of the heavy electric system. By avoiding the flow of the dark current, a discharging of the battery element 2b of the heavy electric system can be prevented.

Further, by employing each voltage detector and each temperature detector, a voltage and a temperature of each battery element can be measured. As each voltage detector is compact and low cost, this is optimum as a voltage detector for an electric car in managing the voltage of each of a plurality of battery elements connected in series.

Further, as the voltage-to-frequency converter 17 and the voltage-to-frequency converter 41 are used, frequency information is obtained as an output, with small noise in the output, and this has an effect of obtaining an accurate output.

Furthermore, as the first photo-coupler 25 is used, the light electric system and the heavy electric system are insulated from each other, and it is possible to avoid an application of a heavy electric system voltage to the light electric system in case of an occurrence of an incident.

It should be understood that many modifications and adaptations of the Invention will become apparent to those skilled In the art and it is intended to encompass such obvious modifications and changes in the scope of the claims appended hereto.

What is claimed is:

1. A temperature and voltage detecting unit for detecting the temperature and voltage of each of a plurality of battery elements connected in series that constitute a heavy electric system power supply for an electric car, the temperature and voltage detecting unit comprising:

a temperature detector for detecting a temperature of a corresponding battery element when a voltage from a light electric system power supply is being applied; and a voltage detector for inputting a signal to show whether or not the voltage from the light electric system power supply is being applied to the temperature detector, and, only when the voltage from the light electric system power supply is being applied, for detecting a terminal voltage of the corresponding battery element in a state electrically insulated from the signal.

2. The temperature and voltage detecting unit according to claim 1, wherein the temperature detector comprises:

a light electric system stabilized power supply for stabilizing the light electric system power supply voltage;

a temperature resistance element provided close to a corresponding battery element, for changing a resistance value thereof based on a change in the temperature of the battery element; and a resistance terminal voltage detector operating based on a voltage from the light electric system stabilized power supply, for detecting a terminal voltage of the temperature resistance element to which a constant current flows from the light electric system stabilized power supply.

3. The temperature and voltage detecting unit according to claim 2, wherein the temperature detector further comprises a voltage-to-frequency converter for converting a value of the terminal voltage detected by the resistance terminal voltage detector into frequency information and outputting the frequency information.

4. The temperature and voltage detecting unit according to claim 1, wherein the voltage detector comprises:

a heavy electric system stabilized power supply for stabilizing a voltage supplied from a corresponding battery element;

a voltage supply control section for inputting a signal to show whether or not the light electric system power supply voltage is being applied to the temperature detector, and, when the light electric system power supply voltage is being supplied, for applying the voltage from the corresponding battery element to the heavy electric system stabilized power supply; and a battery element terminal voltage detector operating based on a voltage from the light electric system stabilized power supply, for detecting the terminal voltage of the corresponding battery element.

5. The temperature and voltage detecting unit according to claim 4, wherein the voltage detector further comprises a voltage-to-frequency converter for converting a value of the terminal voltage detected by the battery element terminal voltage detector into frequency information and outputting the frequency information.

6. The temperature and voltage detecting unit according to claim 4, wherein the voltage supply control section comprises:

a light-emitting diode for inputting a signal to show whether or not the light electric system power supply voltage is being applied to the temperature detector, and for emitting light or non-emitting light depending on whether or not the light electric system power supply voltage is being applied;

a photo-transistor for being turned on/off according to light emission/non-light emission of the light-emitting diode;

and a transistor for applying the voltage from the corresponding battery element to the heavy electric system stabilized power supply according to on/off of the phototransistor.

7. A battery element unit, comprising:

the temperature and voltage detecting unit according to claim 1; and a battery element body having a groove for accommodating the temperature and voltage detecting unit on an external wall thereof.

8. A battery element unit, comprising: the temperature and voltage detecting unit according to claim 2; and a battery element body having a groove for accommodating the temperature and voltage detecting unit on an external wall thereof.

9. A battery element unit, comprising:

the temperature and voltage detecting unit according to claim 4; and a battery element body having a groove for accommodating the temperature and voltage detecting unit on an external wall thereof.

* * * * *